United States Patent
Wu et al.

(10) Patent No.: US 9,169,556 B2
(45) Date of Patent: Oct. 27, 2015

(54) TUNGSTEN GROWTH MODULATION BY CONTROLLING SURFACE COMPOSITION

(71) Applicant: Applied Materials, Inc., Santa Clara, CA (US)

(72) Inventors: Kai Wu, Palo Alto, CA (US); Kiejin Park, San Jose, CA (US); Sang Ho Yu, Cupertino, CA (US); Sang-Hyeob Lee, Fremont, CA (US); Kazuya Daito, Santa Clara, CA (US); Joshua Collins, Sunnyvale, CA (US); Benjamin C. Wang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 149 days.

(21) Appl. No.: 13/968,057

(22) Filed: Aug. 15, 2013

(65) Prior Publication Data

US 2014/0106083 A1 Apr. 17, 2014

Related U.S. Application Data

(60) Provisional application No. 61/712,648, filed on Oct. 11, 2012.

(51) Int. Cl.
*C23C 16/08* (2006.01)
*C23C 16/14* (2006.01)
(Continued)

(52) U.S. Cl.
CPC ............... *C23C 16/452* (2013.01); *C23C 16/08* (2013.01); *C23C 16/50* (2013.01)

(58) Field of Classification Search
CPC ........ C23C 16/06; C23C 16/08; C23C 16/14; C23C 16/50
See application file for complete search history.

(56) References Cited

U.S. PATENT DOCUMENTS

| 5,906,866 A | 5/1999 | Webb |
| 6,358,844 B1 | 3/2002 | Wang et al. |

(Continued)

FOREIGN PATENT DOCUMENTS

| KR | 2005-0011479 A | 1/2005 |
| KR | 2006-0074762 A | 7/2006 |

OTHER PUBLICATIONS

Kajikawa, Yuya, et al., "Nucleation of W during Chemical Vapor Deposition from WF6 and SiH4". Japanese Journal of Applied Physics, vol. 43, No. 6B, 2004, pp. 3945-3950.*

(Continued)

*Primary Examiner* — Bret Chen
(74) *Attorney, Agent, or Firm* — Patterson & Sheridan, LLP

(57) ABSTRACT

A method for selectively controlling deposition rate of a catalytic material during a catalytic bulk CVD deposition is disclosed herein. The method can include positioning a substrate in a processing chamber including both surface regions and gap regions, depositing a first nucleation layer comprising tungsten conformally over an exposed surface of the substrate, treating at least a portion of the first nucleation layer with activated nitrogen, wherein the activated nitrogen is deposited preferentially on the surface regions, reacting a first deposition gas comprising tungsten halide and hydrogen-containing gas to deposit a tungsten fill layer preferentially in gap regions of the substrate, reacting a nucleation gas comprising a tungsten halide to form a second nucleation layer, and reacting a second deposition gas comprising tungsten halide and a hydrogen-containing gas to deposit a tungsten field layer.

20 Claims, 5 Drawing Sheets

(51) Int. Cl.
*C23C 16/50* (2006.01)
*C23C 16/452* (2006.01)

(56) References Cited

U.S. PATENT DOCUMENTS

| | | | |
|---|---|---|---|
| 6,635,965 B1* | 10/2003 | Lee et al. | 257/758 |
| 6,797,340 B2* | 9/2004 | Fang et al. | 427/585 |
| 6,905,543 B1* | 6/2005 | Fair et al. | 117/89 |
| 7,141,494 B2 | 11/2006 | Lee et al. | |
| 7,211,144 B2 | 5/2007 | Lu et al. | |
| 7,589,017 B2 | 9/2009 | Chan et al. | |
| 2004/0202786 A1* | 10/2004 | Wongsenakhum et al. | 427/250 |
| 2006/0264031 A1* | 11/2006 | Xi et al. | 438/627 |
| 2006/0292874 A1* | 12/2006 | Kori et al. | 438/685 |
| 2008/0206987 A1* | 8/2008 | Gelatos et al. | 438/654 |
| 2009/0149022 A1* | 6/2009 | Chan et al. | 438/660 |
| 2010/0267230 A1 | 10/2010 | Chandrashekar et al. | |
| 2012/0199887 A1* | 8/2012 | Chan et al. | 257/288 |
| 2012/0231626 A1 | 9/2012 | Lee et al. | |
| 2012/0244699 A1 | 9/2012 | Khandelwal et al. | |
| 2015/0050807 A1* | 2/2015 | Wu et al. | 438/669 |

OTHER PUBLICATIONS

Elam, J.W., et al., "Nucleation and growth during tungsten atomic layer deposition on SiO2 surfaces". Thin Solid Films 386 (2001) 41-52.*

Kim, Choon-Hwan, et al., "Pulsed CVD-W Nucleation Layer Using WF6 and B2H6 for Low Resistivity W". Journal of the Electrochemical Society, 156 (9) H685-H689 (2009).*

International Search Report received dated Nov. 27, 2013 for related application PCT/US2013/055833.

* cited by examiner

TUNGSTEN GROWTH MODULATION BY CONTROLLING SURFACE COMPOSITION

CROSS-REFERENCE TO RELATED APPLICATIONS

This application claims benefit of U.S. Provisional Patent Application Ser. No. 61/712,648, filed Oct. 11, 2012, which is herein incorporated by reference.

BACKGROUND OF THE INVENTION

1. Field of the Invention

Embodiments of the invention relate generally to methods for processing a substrate during semiconductor manufacturing. Specifically, embodiments of the invention relate to methods of treating a nucleation layer prior to a CVD deposition process.

2. Description of the Related Art

Reliably producing nanometer-sized features is one of the key technologies for the next generation of semiconductor devices. The shrinking dimensions of circuits and devices have placed additional demands on processing capabilities. The multilevel interconnects that lie at the heart of integrated circuit technology require precise processing of high aspect ratio features, such as vias and other interconnects. Reliable formation of these interconnects is very important to future success and to the continued effort to increase circuit density and quality of individual substrates.

Metallization of features formed on substrates includes CVD deposition of metals such as tungsten. Tungsten can be used for metal fill of source contacts, drain contacts, metal gate fill and gate contacts as well as applications in DRAM and flash memory. As feature dimensions shrink, it becomes increasingly difficult to fill features with cross-sectional dimensions of less than 20 nm while maintaining the filled regions void-free. Additionally, post-processing steps such as CMP of the tungsten layer and tungsten etchback (dry and wet) can open voids or even seams to create integration problems if tungsten fill is not near-perfect.

Re-entrant features, in which the upper part of the feature is smaller than the lower part, cannot be filled seam-free by current techniques, even with 100% conformal tungsten processing. Tungsten CVD fill has evolved to near 100% conformality over the last 20 years. However, current techniques fail to achieve more fill inside features than on the field with conventional ALD-tungsten nucleation followed by tungsten halide and $H_2$ bulk CVD fill. The resulting seams are exposed to slurry during tungsten CMP, or tungsten etch chemistry during tungsten etchback. The CMP slurry or etchback chemistry enters seams from tungsten CVD processing, enlarges them, and can lead to significant integration issues downstream.

Therefore, there is much effort in the art to create a tungsten deposition process with enhanced bottom-up tungsten growth for seam-free tungsten fill of features.

SUMMARY OF THE INVENTION

Embodiments of the present invention generally provide a methods of forming and treating a nucleation layer to control deposition of tungsten into trenches and vias preferentially. In one embodiment, a method of controlling nucleation in a CVD process can include reacting a first nucleation gas comprising a tungsten halide and a reactant gas to deposit a first nucleation layer, forming a plasma from a nitrogen-containing gas to create an activated nitrogen, treating at least a portion of the first nucleation layer with the activated nitrogen, wherein the activated nitrogen is deposited preferentially on the surface regions, reacting a first deposition gas comprising tungsten halide and hydrogen-containing gas to deposit a tungsten fill layer, reacting a second nucleation gas comprising tungsten halide and the reactant gas to deposit a first nucleation layer, and reacting a second deposition gas comprising tungsten hexafluoride and a hydrogen gas to deposit a tungsten field layer.

In another embodiment, a method of controlling nucleation in a CVD process can include depositing a first nucleation layer comprising tungsten, treating at least a portion of the first nucleation layer with activated nitrogen, wherein the activated nitrogen is deposited preferentially on the surface regions; reacting a first deposition gas comprising tungsten halide and hydrogen-containing gas to deposit a tungsten fill layer, depositing a nucleation gas comprising a tungsten halide to form a second nucleation layer, and reacting a second deposition gas comprising tungsten halide and a hydrogen-containing gas to deposit a tungsten field layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally provide a methods of forming and treating a nucleation layer to control deposition of tungsten into trenches and vias preferentially. Deposition of tungsten in features by prior art techniques can lead to the creation of seams, which are regions where nucleated growth from tungsten CVD have grown together. These seams can, in many cases, have flaws such as gaps which form during the growth due to one portion of the wall growing at a slightly different rate than another portion of a wall. These gaps, as described above, can be exacerbated by post-deposition processing, such as during CMP. By controlling the areas where the CVD deposited tungsten can grow, these deleterious effects can be avoided. The embodiments disclosed herein are more clearly described with reference to the figures discussed below.

Figure 1:
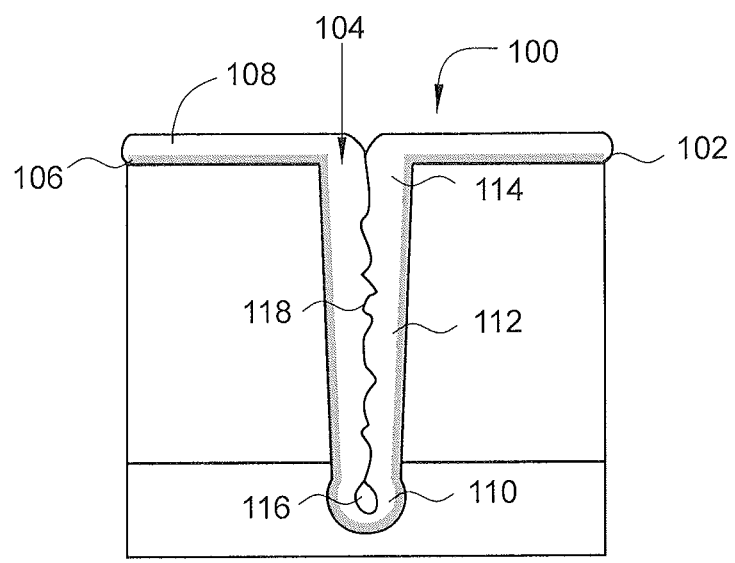
FIG. 1 is a cross-sectional view of a substrate with a feature according to standard tungsten deposition techniques.

FIG. 1 is a cross-sectional view of a substrate 100 with a feature according to standard tungsten deposition techniques. As depicted herein, the substrate 100 has an exposed field surface 102 and a feature 104. The substrate 100 can be of a standard composition, such as crystalline silicon substrate. The feature 104 can be an etched feature, such as a via or a trench. The feature 104 formed therein can have varying cross-sectional dimensions. For example, the substrate 100 can have a feature 104 with a width that varies from 4 to 8 nm, an overall depth of 110 nm and an aspect ratio of 25:1.

The thin tungsten layer 106 may be deposited by chemical reaction over the exposed field surface 102 and the feature 104, such as a thin conformal layer deposited by atomic layer deposition (ALD). Over the thin tungsten layer 106 is the tungsten fill layer 108. The tungsten fill layer 108 is deposited conformally over the thin tungsten layer 106. As the layer grows from all surfaces simultaneously and at the same rate, two problems can occur. First, in the feature 104, where the width of a bottom area 110 is wider than the width of the feature 104 in the middle area 112 or at the top area 114, the middle area 112 or top area 114 can grow together prematurely creating a void 116. Second, in an expectedly more common event, areas of the feature 104 can growing together simultaneously, as opposed to upwards from the bottom area 110. This growth pattern in the feature 104 can create a seam 118 which forms when the growth from the tungsten fill layer 108 meets. The seam 118 creates space for post-processing reactants to damage the uniformity of the tungsten fill layer 108, such as those used in conjunction with a CMP.

By treating a portion of the nucleation layer with nitrogen, nucleation can be slowed down in the nucleated areas. Thereby, these anomalies can be largely avoided in growth of the tungsten layers. Embodiments include nitridation of a portion of a nucleation layer to form tungsten nitride (WN). The nitridation primarily occurs on the field region of the substrate with much less nitrogen travelling into the features formed in the surface of the substrate, such as vias and trenches. The WN acts to increase the time required for deposition of tungsten by the bulk deposition processes in field regions by reducing the activation of the hydrogen precursor.

Various techniques can be implemented to apply the surface nitridation, but the nitridation should be greater in the field than inside the one or more features. Direct plasma nitridation results in preferential nitridation on the field. Direct nitrogen plasma may be used with or without bias. It is also possible to use nitrogen containing remote plasma nitridation. In this case, there is no ionized nitrogen present. However, diffusion limitations can still result in more nitridation in the field than deep in the features. The final result is high comparative tungsten nucleation delay on the field as compared to nucleation in the feature. Once tungsten growth is established in the feature, it accelerates from the point of nucleation (in this case, a bottom-up mechanism) and results in seamless tungsten fill.

Figure 2:
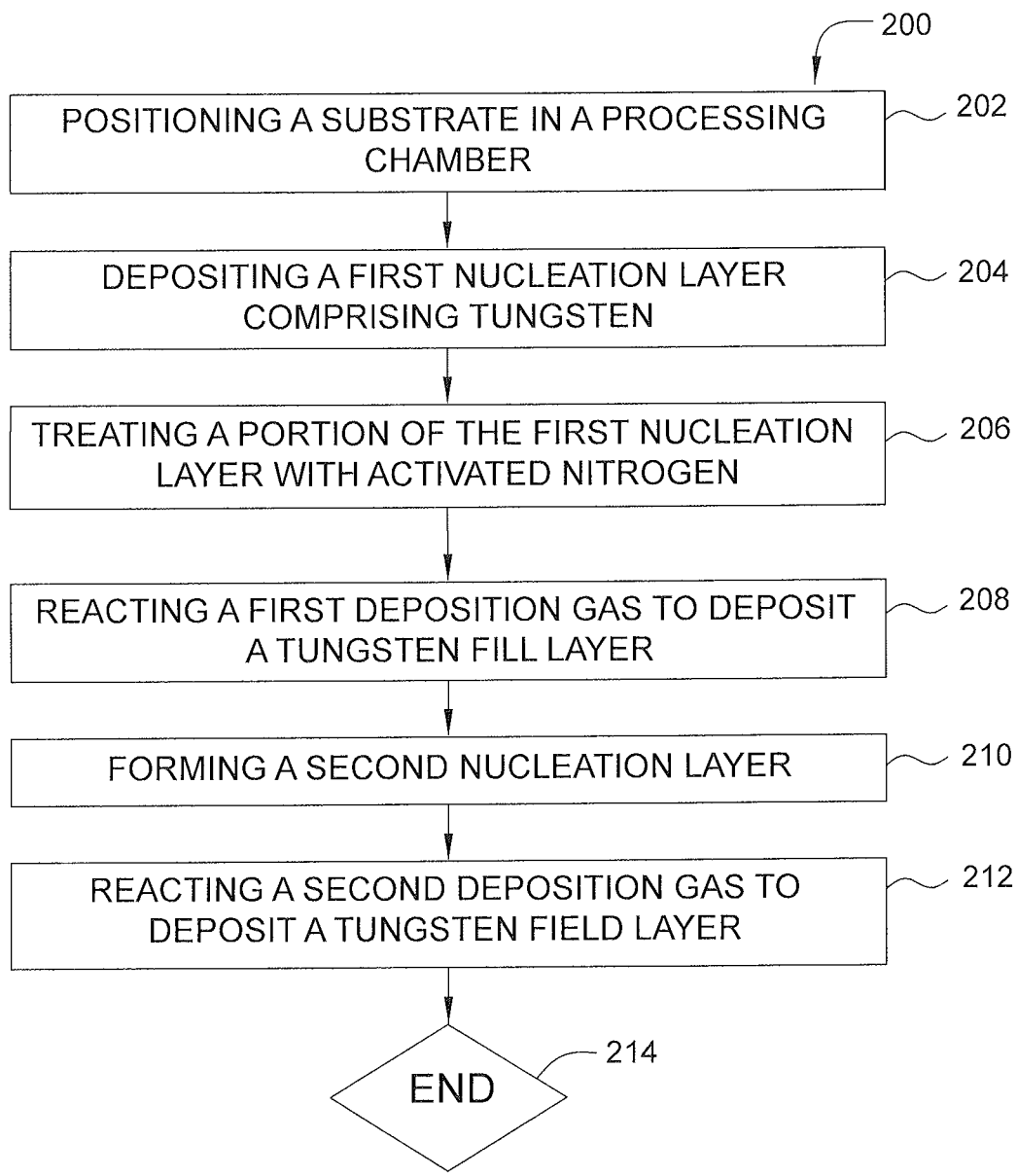
FIG. 2 is a block diagram of a method for depositing a seamless tungsten fill according to one embodiment.

FIG. 2 is a block diagram of a method 200 for depositing a seamless tungsten fill according to one embodiment. The method 200 can include positioning a substrate in a processing chamber. The substrate can be of any composition, such as a crystalline silicon substrate. The processing chamber used with one or more embodiments can be any CVD processing chamber, such as a Centura CVD W deposition chamber available from Applied Materials, Inc located in Santa Clara, Calif. Flow rates and other processing parameters described below are for a 200 mm substrate. It should be understood these parameters can be adjusted based on the size of the substrate processed and the type of chamber used without diverging form the invention disclosed herein.

The method 200 can include depositing a first nucleation layer comprising tungsten, as in 204. In this embodiment, the first nucleation layer is deposited by an ALD process. The ALD process can include adsorption of a tungsten halide over the exposed surface of the substrate. The tungsten halide may be selected from all available tungsten halides, such as tungsten hexafluoride ($WF_6$) or tungsten hexachloride ($WCl_6$). The tungsten halide can be provided to the substrate at a constant pressure, such as 5 Torr. Further, the tungsten halide can be adsorbed at a temperature between 250° C. and 350° C., such as 300° C.

After the tungsten halide has been adsorbed on the substrate, the chamber can then be purged of the remaining gases using an inert gas, such as argon. The substrate can then be treated with a reactant gas, such as diborane, silane or disilane which reacts with the adsorbed tungsten halide to produce metallic tungsten on the adsorbed surfaces and halide gases which are purged as above. The deposited thin tungsten layer can have a final thickness of between 10 Å and 100 Å, such as 25 Å. It is important to note that other embodiments may include nucleation layers formed by other techniques, without diverging from the invention described herein.

The method 200 can include treating a portion of the first nucleation layer with activated nitrogen, as in 206. In this embodiment, the surface of the substrate has a thin tungsten layer which is treated with an activated nitrogen. In this context, activated nitrogen can mean a plasma comprising nitrogen or an active species which remains after plasma formation (e.g. a plasma comprising a nitrogen-containing gas formed in a remote plasma source). The nitrogen can be delivered through various nitrogen-containing precursors, such as $N_2$, $NH_3$, $H_2$, Ar, He, Ne or other similar gases and combinations of gases.

The activated nitrogen is delivered to the surface of the substrate and reacts with the metallic tungsten to form WN. As described earlier, the WN prevents initial nucleation of tungsten on the surface, thereby it slows down growth of tungsten where it is present. When the nitrogen is delivered as a plasma, it is delivered either with no bias or a low bias, to preclude nitrogen deposition at the bottom of features. The ionized particles with generally collide with sidewalls or the upper surface before reaching the bottom of the feature. When the nitrogen is delivered as an activated gas from a quenched plasma, there is no directionality of the nitrogen gas. However, the activated nitrogen still has a level of internal motion and is thus diffusion limited.

It is preferred to use higher incubation times of the nitrogen containing-gas as opposed to lower incubation times. It is believed that the nitrogen requires a time above 10 seconds to properly incorporate into the nucleation layer. Experimental analysis of a 10 second surface treatment with a $N_2$ flow rate between 0 sccm and 160 sccm had no effect on nucleation and subsequent deposition of tungsten during bulk deposition by CVD. Further experimental data shows that a 60 second surface treatment with a $N_2$ flow rate between 0 sccm and 160 sccm created between a 25 and 30 second delay in nucleation and subsequent deposition of tungsten during bulk deposition by CVD.

Without intending to be bound by theory, it is believed that the nitrogen will preferentially deposit on the upper surface. However, it is further believed that the nitrogen will deposit on the sidewalls of the feature creating a gradient of nitridation on the tungsten layer on the sidewall of the feature. Diffusion of the nitrogen into the features formed on the substrate is controlled by the energy level of the gas, the directionality of the gas, the size of the feature and the aspect ratio of the feature. Thus, it is believed that nitrogen should be delivered either as a low energy plasma or as an activated gas from a quenched plasma. A low energy plasma or an activated gas will have random directionality which can increase the likelihood of colliding with a sidewall or the upper surface. Further, smaller features with higher aspect ratios will have lower diffusion of the nitrogen into the feature than larger features or lower aspect ratio features. Thus, this technique provides a secondary benefit in that features are only expected to decrease in size as technology advances.

The method 200 can include reacting a first deposition gas to deposit a tungsten fill layer, as in 208. After, the WN surface has been formed on the upper sidewalls of features and the upper surface of the thin tungsten layer, a tungsten fill layer is deposited by a CVD process. The CVD process can be any available CVD process, such as a thermal CVD process. The reactant gases for the CVD can include a tungsten halide, such as $WF_6$ or $WCl_6$, and a hydrogen-containing gas, such as $H_2$. The hydrogen containing gas should require catalysis, so as to minimize deposition on WN surfaces.

Not wishing to be bound by theory, it is believed that the tungsten hexafluoride ($WF_6$) or tungsten hexachloride ($WCl_6$) is adsorbed on the exposed surface of the substrate which reacts to form $WF_5$ and F. The $H_2$ is catalyzed by the exposed and unbound tungsten to form H atoms from $H_2$. The H atoms can then react with the adsorbed F to create HF which desorbs from the surface leaving behind metallic tungsten and further adsorption sites. The reaction mechanism of $WF_6$ can be summarized as follows:

$$WF_6 \rightarrow WF_5 + F$$

$$H_2 \rightarrow 2H$$

$$WF_5 + 6H + F \rightarrow 6HF + W$$

$WCl_6$ is believed to have a similar reaction mechanism. The reaction mechanism above requires an available catalyst for the formation of H atoms from $H_2$. In the absence of a catalyst, the available binding sites for $WF_6$ is rate limiting. Since WN is not a good catalyst for the formation of H atoms, the nitridation of the thin tungsten layer slows down nucleation of the bulk tungsten layer.

Since WN is formed on the upper sidewalls of features and the upper surface of the thin tungsten layer, the preferential nucleation site becomes the bottom of the feature. The $WF_6$ is adsorbed on all available surfaces but since the formation of atomic hydrogen from $H_2$ is catalyzed significantly better at tungsten surfaces than WN surfaces, nucleation is slower at tungsten surfaces than at WN surfaces. Temperature also affects the formation of atomic hydrogen from $H_2$. As such, the growth temperature for the tungsten fill layer can be between 250° C. and 450° C., with preferred embodiments between 300° C. and 350° C.

The method 200 can include forming a second nucleation layer, as in 210. As stated previously, post-processing steps after tungsten deposition generally include CMP and tungsten etchback, to provide a planar surface with tungsten filled features. Thus, a layer of conformal tungsten is generally deposited to protect the underlying layer while removing excess deposition from previous steps. Though nucleation and subsequent deposition will eventually occur on the WN surfaces, it is believed to be beneficial to enhance growth on the WN surfaces once the feature is filled to provide a more uniform surface for these post-processing steps.

The nucleation layer can be deposited using a tungsten halide, such as $WF_6$ or $WCl_6$. As in previous steps, the tungsten halide is allowed to adsorb on the thin tungsten layer as well as WN surfaces. After the tungsten halide has been adsorbed, the chamber can then be purged of the remaining gases using an inert gas, such as argon. The substrate can then be treated with a reactant gas, such as diborane, silane or disilane which reacts with the adsorbed tungsten halide to produce metallic tungsten on the adsorbed surfaces and halide gases. The halide gases are purged as above to prevent further interaction with the substrate. By using a reactant gas which does not require catalytic activity from the tungsten, a thin tungsten layer can be redeposited on the exposed surfaces without consideration for the low catalytic activity form the WN.

The method 200 can include reacting a second deposition gas to deposit a tungsten field layer over the second nucleation layer as in 212. The thin tungsten layer which was conformally deposited in 210 can catalyze the formation of a tungsten field layer. A tungsten field layer is deposited by a CVD process. The CVD process can be any available CVD process, such as a thermal CVD process. The reactant gases for the CVD can include a tungsten halide, such as $WF_6$ or $WCl_6$ and a hydrogen-containing gas, such as $H_2$. For the formation of the tungsten field layer in one embodiment, it is not necessary that the hydrogen-containing gas be catalyzed to form atomic hydrogen. For this embodiment, selectivity between tungsten and WN in nucleation is not necessary for formation of the tungsten field layer.

Once the tungsten field layer is then deposited on the second nucleation layer to a desired thickness, the method 200 can be halted, as in 214. In preferred embodiments, the thickness of the tungsten field layer once deposition is complete is between 1500 Å to 3500 Å. The substrate can then be removed from the chamber for further processing.

Figure 3A:
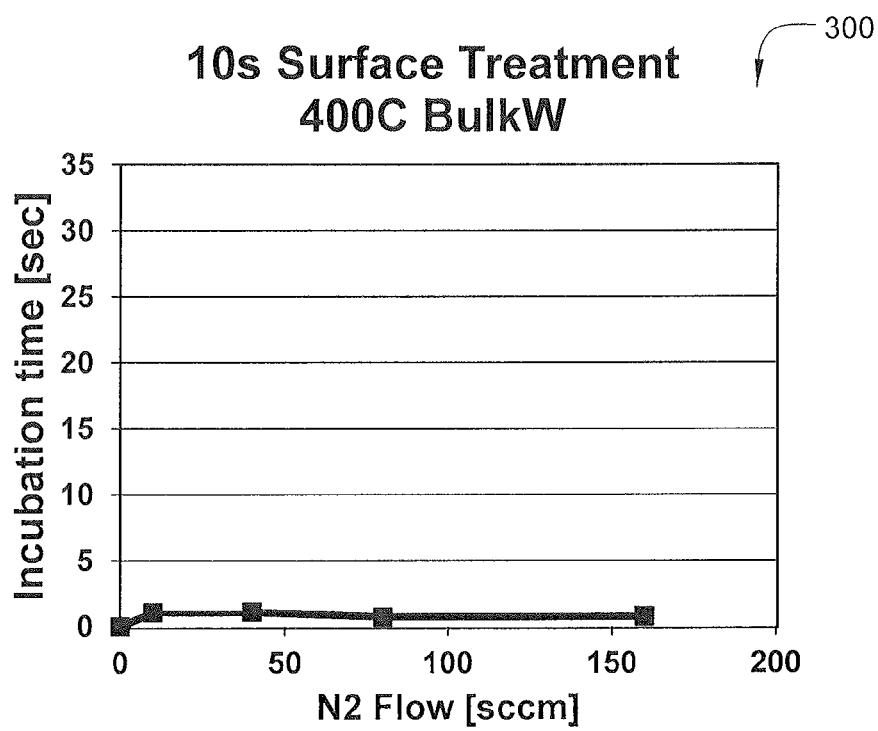
FIGS. 3A-3C are graphs depicting the effects of nitrogen treatment on tungsten nucleation delay, according to one or more embodiments.
Figure 3B:
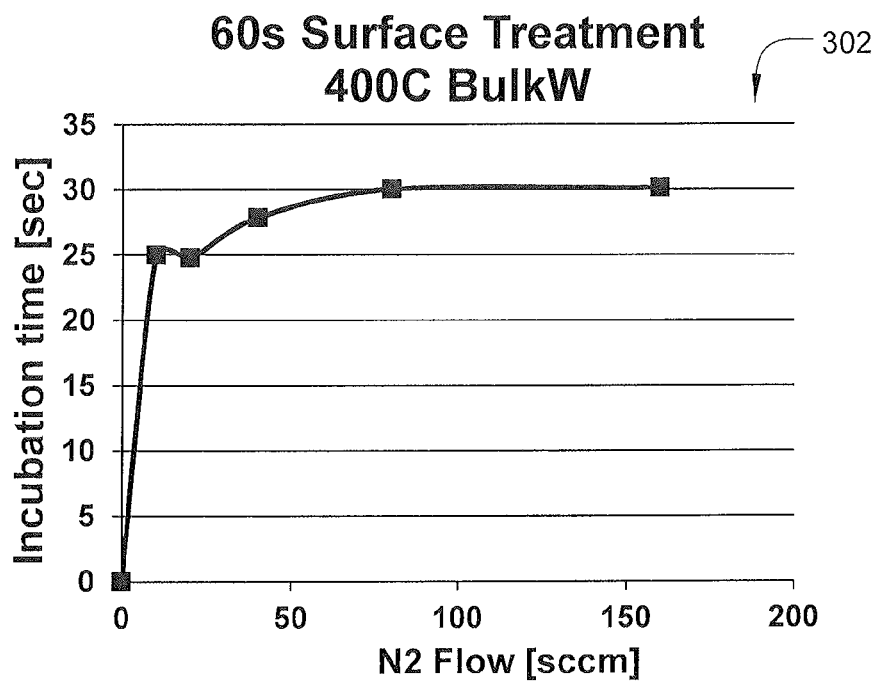
Figure 3C:
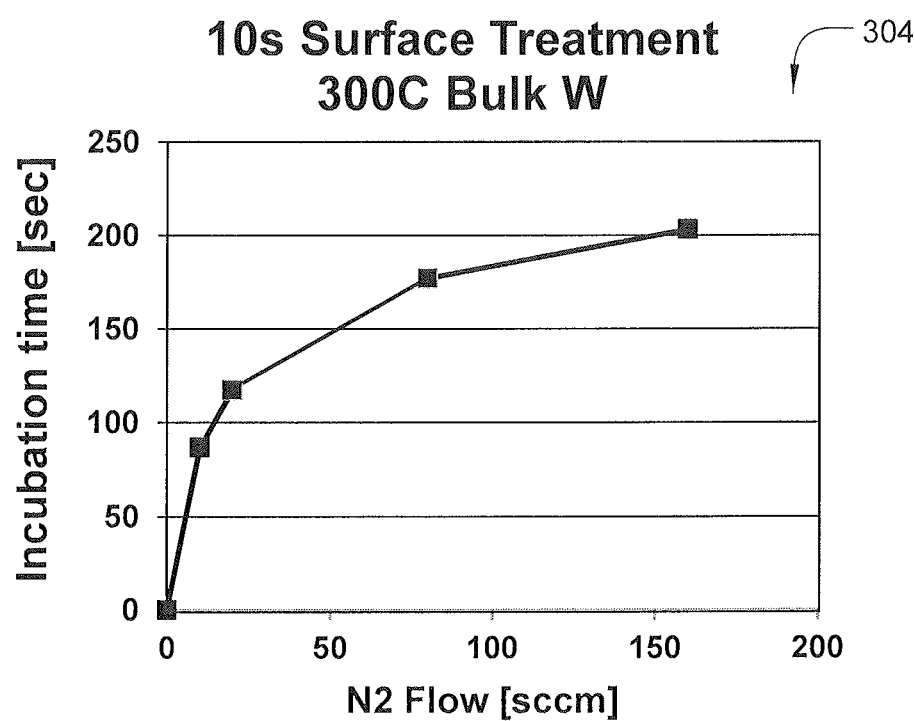

FIGS. 3A-3C are graphs depicting the effects of nitrogen treatment on tungsten nucleation delay, according to one or more embodiments. The substrates used for the analysis did not have features formed on the surface. A thin tungsten layer was deposited on the substrates by an ALD process using $WF_6$ and diborane. The thin layers were deposited at 300° C. at 5 Torr. The overall thickness of the thin tungsten layer was approximately 25 Å. The activated nitrogen comprised $N_2$ and Ar and was activated by remote plasma at a power greater than 1000 W. The incubation time for the substrates was plotted for each graph at varying $N_2$ flow rates from 0 sccm to 160 sccm.

FIG. 3A is a graph 300 depicting surface treatment of a substrate with low exposure time and high temperature prior to bulk tungsten deposition. The substrates were treated with $N_2$ for 10 seconds at varying $N_2$ flow rates with data points at 0, 10, 40 80 and 160 sccm. After treatment with $N_2$, the substrate was exposed to a standard composition of $WF_6$ and $H_2$ at 400° C. so as to determine the incubation time required for bulk tungsten deposition. Under these parameters, the nitrogen treatment had no significant effect of the time to deposition on the thin tungsten layer. The shift in incubation time between the 0 sccm $N_2$ sample and the remaining data points was less than 1 second.

FIG. 3B is a graph 302 depicting surface treatment of a substrate with a high exposure time and high temperature. The substrates were treated with $N_2$ for 60 seconds at varying $N_2$ flow rates with data points at 0, 10, 40 80 and 160 sccm. After treatment with $N_2$, the substrate was exposed to a same composition of $WF_6$ and $H_2$ at 400° C. for bulk tungsten deposition. Treatment with $N_2$ for 60 seconds shows a significant increase in incubation time for nucleation of the bulk tungsten layer. The shift in incubation time between the 0 sccm $N_2$ sample and the 10 sccm $N_2$ sample was approximately 25 seconds. The maximum increase seen in test samples under these parameters was a 30 second delay for the 100 sccm and 160 sccm data points.

FIG. 3C is a graph 304 depicting surface treatment of a substrate at low time and low temperature. The substrates were treated with $N_2$ for 10 seconds at varying $N_2$ flow rates with data points at 0, 10, 40 80 and 160 sccm. After treatment with $N_2$, the substrate was exposed to a same composition of $WF_6$ and $H_2$ at 300° C. for bulk tungsten deposition. Treatment with $N_2$ for 10 seconds at 300° C. shows a significant increase in incubation time for nucleation of the bulk tungsten layer as compared to either FIG. 3A or 3B. The shift in incubation time between the 0 sccm $N_2$ sample and the 10 sccm $N_2$ sample was approximately 75 seconds. Increased flow rate showed further significant increase over the previous samples without apparently leveling off as in FIG. 3B. The maximum increase seen in test samples under these parameters was an approximately 200 second delay for the 160 sccm data points. Based on the data points, further increase with increased flow rate is expected.

In the embodiments above, a 10 second treatment incubation delay due to $N_2$ poisoning at any flow rate appears to be counteracted at higher temperatures for deposition of the bulk tungsten layer, such as temperatures above 400° C. Thus it is believed that the bulk tungsten layer should be deposited at temperatures below 400° C. if the nitrogen treatment is for a short time period, such as a 10 second $N_2$ treatment. The shorter incubation delay of substrates exposed to higher flow rates of $N_2$ for longer periods with subsequent deposition of the bulk tungsten layer at higher temperatures might be exploited for further embodiments, such as deposition of the tungsten fill layer with subsequent deposition of the tungsten field layer in one step (without the formation of the second thin tungsten layer.

Further embodiments can employ a temperature changing strategy to achieve proper tungsten fill in the via and subsequent filed deposition. For example, one embodiment can include nitridation of a thin tungsten layer at a high flow rate, such as 160 sccm, deposition of the tungsten fill layer at a low temperature, such as between 250° C. and 350° C., for a period of time which is less than the incubation time for deposition on the WN layer and then raising the temperature to a high temperature, such as greater than 400° C. to deposit the tungsten field layer. One skilled in the art will understand that there are a variety of permutations which can be performed without diverging from the embodiments disclosed herein.

FIG. 4A-4D are magnified images of a substrate with a filled feature according to one or more embodiments. A silicon substrate with multiple features formed thereon was positioned in a processing chamber. A thin tungsten layer was deposited on the substrates by an ALD process using $WF_6$ and diborane. The thin layers were deposited at 300° C. at 5 Torr. The overall thickness of the thin tungsten layer was approximately 25 Å. The activated nitrogen comprised $N_2$ and Ar and was activated by remote plasma at a power greater than 1000 W.

Figure 4A:
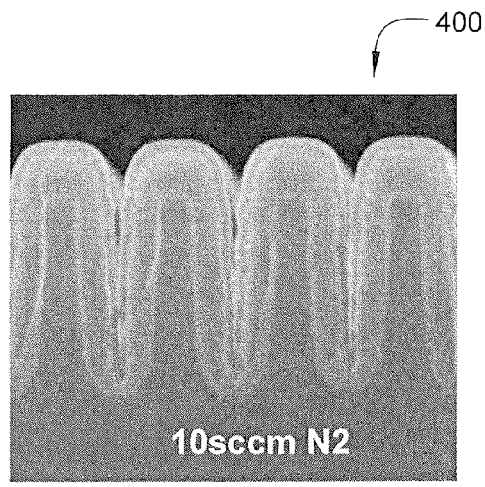
FIG. 4A-4D are magnified images of a substrate with a filled feature according to one or more embodiments.

FIG. 4A is a magnified image 400 of a substrate pretreated with activated nitrogen with low nitrogen flow and low temperature bulk tungsten deposition. The substrate was further treated with the activated nitrogen as above at 10 sccm for 10 seconds. After nitrogen treatment, bulk tungsten was deposited by CVD using $WF_6$ and $H_2$ with a pressure of 300 Torr at 300° C. for 120 seconds. Three features are visible in image 400 with the outer layer being the bulk tungsten layer. The features in the substrate have bulk tungsten deposition which has grown together beginning at the bottom of the feature, thus preventing gap formation. As visible in the image 400, nucleation on the surface and the sidewalls is diminished compared to the bottom of the feature.

Figure 4B:
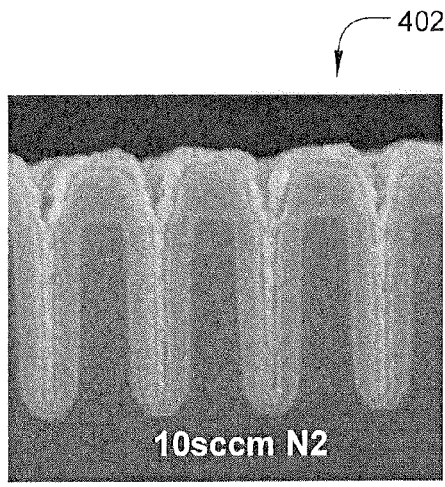

FIG. 4B is a magnified image 402 of a substrate pretreated with activated nitrogen with low nitrogen flow and high temperature bulk tungsten deposition. The substrate was further treated with the activated nitrogen as above at 10 sccm for 10 seconds. After nitrogen treatment, bulk tungsten was deposited by CVD using $WF_6$ and $H_2$ with a pressure of 300 Torr at 400° C. for 30 seconds. Three features are visible in the image 402 with the outer layer being the bulk tungsten layer. As expected from the results in FIG. 3B, nucleation has begun on the surface of the thin tungsten layer, even in the presence of nitridation. Also, there are some signs that gaps have formed at the bottom of at least one of the features.

Figure 4C:
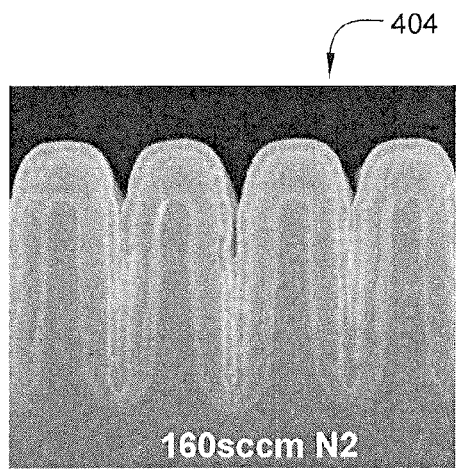

FIG. 4C is a magnified image 404 of a substrate pretreated with activated nitrogen with high nitrogen flow and low temperature bulk tungsten deposition. The substrate was further treated with the activated nitrogen as above at 160 sccm for 10 seconds. After nitrogen treatment, bulk tungsten was deposited by CVD using $WF_6$ and $H_2$ with a pressure of 300 Torr at 300° C. for 120 seconds. Three features are visible in the image 404 with the outer layer being the bulk tungsten layer. The image 404 shows that nucleation is dramatically diminished on the upper portion of the features and the upper surface as opposed to the bottom of the feature. Further there are no signs of gap formation in the feature.

Figure 4D:
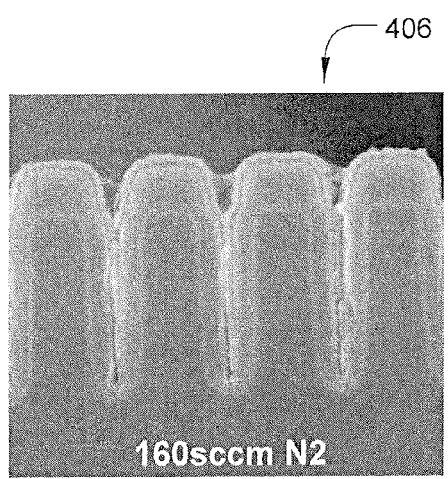

FIG. 4D is a magnified image 406 of a substrate pretreated with activated nitrogen with high nitrogen flow and high temperature bulk tungsten deposition. The substrate was further treated with the activated nitrogen as above at 10 sccm for 10 seconds. After nitrogen treatment, bulk tungsten was deposited by CVD using $WF_6$ and $H_2$ with a pressure of 300 Torr at 400° C. for 30 seconds. Three features are visible in the image 406 with the outer layer being the bulk tungsten layer. As visible in the image, gaps have clearly formed in two of the three of the features in the frame. As well, sidewall growth and upper surface growth of the bulk tungsten layer is either equal to or greater than the growth at the bottom of the feature.

The active nitrogen diffuses into the upper surface of the substrate and appears to have a gradient of diffusion into the features with minimal diffusion into the thin tungsten layer disposed on the bottom of the feature. As shown in FIGS. 4A-4D, high $N_2$ flow during surface treatment enhances the ratio of in-feature tungsten CVD growth over upper surface tungsten CVD growth, which is believed to be related to the effect of the WN formation. Further, low temperature deposition of bulk tungsten by CVD enhances field versus in-feature bulk tungsten growth selectivity. These selectivity increases are shown to be cumulative in FIG. 4C. In each case, a void-free feature fill was achieved due to the reduction in catalytic activity of the field region by the formation of WN on the surface.

CONCLUSION

Embodiments of the present invention generally provide a methods of forming and treating a nucleation layer to slow deposition of tungsten on treated surfaces and improve feature fill. As features decrease in size, such as below 20 nm, proper tungsten fill in those features becomes more difficult. Movement of tungsten into feature can be inhibited by deposition in area of the feature more proximate to the upper surface of the substrate. By controlling incorporation of nitrogen into the tungsten nucleation layer, bulk CVD deposition of tungsten could be slowed in regions where less deposition is desired and allowed to proceed at normal rate in areas where more deposition of tungsten is desired.

While the foregoing is directed to embodiments of the invention, other and further embodiments of the invention may be devised without departing from the basic scope thereof, and the scope thereof is determined by the claims that follow.

What is claimed is:

1. A method of controlling nucleation in a CVD process, comprising:
   positioning in a processing chamber a substrate comprising both surface regions and gap regions;
   depositing a first nucleation layer comprising tungsten conformally over the surface regions and the gap regions;
   treating at least a portion of the first nucleation layer with activated nitrogen, wherein the activated nitrogen is deposited preferentially on the surface regions;
   reacting a first deposition gas comprising a first tungsten halide and a first hydrogen-containing gas to deposit a tungsten fill layer over the first nucleation layer, wherein the tungsten fill layer is preferentially deposited in gap regions of the substrate;
   reacting a nucleation gas comprising a second tungsten halide to form a second nucleation layer over the tungsten fill layer; and
   reacting a second deposition gas comprising a third tungsten halide and a second hydrogen-containing gas to deposit a tungsten field layer over the second nucleation layer.

2. The method of claim 1, wherein at least one of the tungsten fill layer and the tungsten field layer is deposited at a temperature between 250° C. and 350° C.

3. The method of claim 1, wherein the activated nitrogen is formed by remote plasma, the activated nitrogen being a component of a quenched plasma.

4. The method of claim 1, wherein at least one of the first tungsten halide, second tungsten halide or third tungsten halide are selected from the group consisting of tungsten hexafluoride ($WF_6$), tungsten hexachloride ($WCl_6$) and combinations thereof.

5. The method of claim 1, wherein activated nitrogen comprises a source gas selected from the group consisting of $N_2$, $NH_3$, $H_2$, Ar, He, Ne and combinations thereof.

6. The method of claim 5, wherein the source gas comprises $N_2$ and Ar.

7. The method of claim 1, wherein the substrate is treated with activated nitrogen for a time period of 10 seconds or less.

8. The method of claim 7, wherein the tungsten field layer is deposited at a temperature greater than 400° C.

9. The method of claim 1, wherein the substrate is treated with activated nitrogen for a time period of at least 30 seconds.

10. The method of claim 9, wherein the tungsten field layer is deposited at a temperature less than 400° C.

11. A method of controlling nucleation in a CVD process, comprising:
    positioning a substrate in a processing chamber, the substrate having an exposed surface comprising surface regions and gap regions;
    reacting a first nucleation gas comprising a first tungsten halide and a reactant gas to deposit a first nucleation layer over the exposed surface;
    forming a plasma from a nitrogen-containing gas to create an activated nitrogen;
    treating at least a portion of the first nucleation layer with the activated nitrogen, wherein the activated nitrogen is deposited preferentially over the surface regions;
    reacting a first deposition gas comprising a second tungsten halide and first hydrogen-containing gas to deposit a tungsten fill layer on at least a portion of the first nucleation layer;
    reacting a second nucleation gas comprising a third tungsten halide and the reactant gas to deposit a second nucleation layer over the tungsten fill layer; and
    reacting a second deposition gas comprising tungsten hexafluoride and hydrogen gas to deposit a tungsten field layer on the second nucleation layer.

12. The method of claim 11, wherein at least one of the tungsten fill layer and the tungsten field layer is deposited at a temperature between 250° C. and 350° C.

13. The method of claim 11, wherein the activated nitrogen is formed by remote plasma, the activated nitrogen being a component of a quenched plasma.

14. The method of claim 11, wherein the activated nitrogen is delivered to the substrate as a plasma, the substrate being unbiased during the treatment with the activated nitrogen.

15. The method of claim 11, wherein at least one of the first tungsten halide, second tungsten halide or third tungsten halide selected from the group consisting of tungsten hexafluoride ($WF_6$), tungsten hexachloride ($WCl_6$) and combinations thereof.

16. The method of claim 11, wherein activated nitrogen comprises a source gas selected from the group consisting of $N_2$, $NH_3$, $H_2$, Ar, He, Ne and combinations thereof.

17. The method of claim 16, wherein the activated nitrogen is delivered to the substrate as a plasma.

18. The method of claim 11, wherein the substrate is treated with activated nitrogen for a time period of at least 30 seconds.

19. The method of claim 18, wherein the tungsten field layer is deposited at a temperature less than 400° C.

20. The method of claim 11, wherein the chamber is purged using an inert gas after the formation of each nucleation layer.

* * * * *